United States Patent [19]
Wu

[11] Patent Number: 6,096,614
[45] Date of Patent: Aug. 1, 2000

[54] METHOD TO FABRICATE DEEP SUB-μM CMOSFETS

[75] Inventor: Shye-Lin Wu, Hsinchu, Taiwan

[73] Assignee: Texas Instruments - Acer Incorporated, Hsinchu, Taiwan

[21] Appl. No.: 09/020,229

[22] Filed: Feb. 6, 1998

[51] Int. Cl.$^7$ .................................................. H01L 21/336
[52] U.S. Cl. ........................ 438/303; 438/528; 438/766; 438/775; 257/408
[58] Field of Search ........................... 257/413; 438/232, 438/591, 592, 291, 303, 528, 766

[56] References Cited

U.S. PATENT DOCUMENTS

| | | | |
|---|---|---|---|
| 5,628,221 | 5/1997 | Chao et al. | 438/591 |
| 5,670,397 | 9/1997 | Chang et al. | 438/232 |
| 5,710,454 | 1/1998 | Wu | 257/413 |
| 5,767,004 | 6/1998 | Balasubramanian et al. | 438/592 |

Primary Examiner—Wael Fahmy
Assistant Examiner—William David Coleman
Attorney, Agent, or Firm—Harness, Dickey & Pierce, P.L.C.

[57] ABSTRACT

The method of the present invention is a method to fabricate a MOS device without boron penetration. After growing a gate oxide layer, a thin stacked-amorphous-silicon layer (SAS) is deposited over the oxide layer. Subsequently, a lightly nitrogen ion is implanted into the stacked-amorphous silicon layer. The stacked-amorphous silicon layer is patterned to define a gate structure. Then, a light doped ion implantation is performed to dope ions through the gate oxide layer into the substrate to form lightly doped source and drain regions. A dielectric layer is formed over the gate structure and the gate oxide layer, and the dielectric layer is etched to form sidewall spacers. Next, a second ion implantation is performed to dope ions into the substrate to form source and drain. Finally, a thermal annealing is performed on the stacked-amorphous silicon gate and the substrate. The nitrogen ions in the stacked-amorphous silicon gate are segregated into the gate oxide layer to act as a diffusive barrier, the stacked-amorphous silicon gate being convert into ploy silicon gate and thereby forming shallow source and drain junction in the substrate.

10 Claims, 6 Drawing Sheets

METHOD TO FABRICATE DEEP SUB-μM CMOSFETS

FIELD OF THE INVENTION

The present invention relates to a semiconductor device, and more specifically, to a method of fabricating a complementary metal oxide semiconductor field effect transistor (CMOSFET).

BACKGROUND OF THE INVENTION

Metal oxide semiconductor field effect transistors (MOSFETs) have been traditionally used and widely applied in the semiconductor technologies. For deep sub-micron high performance MOS ULSI application (suggested in the reference by B. Davari, in IEDM Tech. Dig., p.555, 1996), the dual poly gate CMOS technology (p+ poly gate for PMOSFET and n+ poly gate for NMOSFET) is necessary. However, as mentioned in the referenced by Y. Taur, et al., in IEDM Tech. Dig., p. 901, 1992 the effect of boron penetration through the thin gate oxide into silicon substrate will degrade the device performance. There are several methods known to suppress the boron penetration effects, such as (1) $N_2O$ nitridation of thin gate oxide suggested in the reference by E. Hasegawa, et al., in IEDM Tech. Dig., p327, 1995 (2) heavy nitrogen implantation (dosage $\geq$ 4E 15 cm-2) into poly-Si suggested in the reference by S. Shimizu, et al., in IEDM Tech. Dig., p.67, 1994, and (3) the stacked-Si layer as gate material suggested in the reference by S. L. Wu, et al., in IEDM Tech. Dig., p329, 1993.

Although the heavy nitrogen implantation into poly-Si layer could effectively suppress the boron penetration effects, the sheet resistance of poly gate will be largely increased with the increase of nitrogen dosage for both n+ and p+ poly gates, especially for the nitrogen dosage larger than 4E15 $cm^{-2}$. This is shown in the reference by S. Shimizu, et al., J. Appl. Phys., vol. 35, p.802, 1996.

SUMMARY OF THE INVENTION

This invention proposes a simple method to fabricate dual gate CMOS devices without boron penetration effects. The detailed processes are described as follows. After growing the thin gate oxide film on silicon substrate, a thin stacked amorphous-Si (SAS) layer was deposited on all regions. A lightly nitrogen ion implantation (dosage $\leq$ 2E 15 $cm^{-2}$) was performed into the thin SAS layer. The poly gate was defined and then LDD implant was done. After forming the dielectric spacers, the S/DlG implant was carried out. A high temperature thermal anneal was used to form a shallow junction. The nitrogen implant could also be implanted after the poly gate definition.

The benefits of this invention are: (1) the device reliability could be improved by using the dual poly gate CMOS technology; (2) the boron penetration effects in p+ poly gate pMOSFETs could be fully suppressed by combining the nitrogen doping technology and the stacked-Si layer as gate material; and (3) the side effects of the heavy nitrogen ion implantation could be avoided.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1(a)–FIG. 1(f) illustrate the drawings of the first embodiment of the present invention;

FIG. 2(a)–FIG. 2(f) illustrate the drawings of the second embodiment;

FIG. 1 (f) is a cross-section view of a semiconductor substrate illustrating the step of performing a high temperature thermal annealing to form shallow junction according to the present invention;

DETAILED DESCRIPTION OF THE PREFERRED EMBODIMENT

The present invention will be described in detail with reference to drawings. The purpose of the present invention is to provide a method for fabricating dual gate CMOS devices without boron penetration. The detailed processes will be described as follows.

Figure 1A:
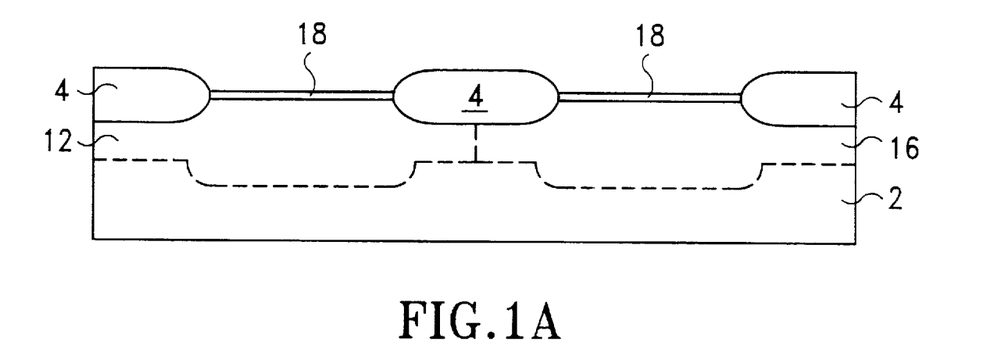
FIG. 1(a) is a cross-sectional view of a semiconductor substrate illustrating the step of growing an ultra-thin gate oxide layer on a semiconductor substrate according to the present invention.

With reference to FIG. 1(a) and in accordance with a preferred embodiment, a single crystal silicon substrate 2 with a <100> crystallographic orientation is provided. A plurality of thick field oxide (FOX) regions 4 is formed to provide isolation between devices on the substrate 2. For example, the FOX regions 4 can be formed via lithography and etching steps to etch a silicon nitride-silicon dioxide composition layer. After the photoresist is removed and wet cleaned, thermal oxidation in an oxygen-steam environment is used to grow the FOX region 4 to a thickness of about 3000–8000 angstroms. The FOX region 4 can be replaced by a plurality of shallow trench isolations, as is well known in the art.

After the FOX regions 4 are formed, a silicon dioxide layer is created on the top of surface of the substrate 2 to serve as a passivation layer. In this preferred embodiment, the silicon dioxide layer is formed in dry $O_2$, wet $O_2$, or $N_2+O_2$ ambient, at a temperature of 800 to 1050 centigrade degrees. Alternatively, the thickness of the silicon dioxide layer is about 50 to 350 angstroms.

Conventional ion implantation is used according to the present invention to form a twin well structure (include a P-well 12 and a N-well 16) in the substrate 2. Next, the silicon dioxide layer is removed by using standard methods such as wet etching or dry etching. After the formation of twin well is completed and the passivation layer is removed, a silicon dioxide layer 18 is formed on the top surface of the substrate 2 to serve as a gate oxide layers. Typically, the silicon dioxide layer 18 is formed in oxygen ambient at a temperature of about 700 to 1100 Centigrade degrees. In this embodiment, the thickness of the silicon dioxide layer is approximately 15 to 250 angstroms. Alternatively, the oxide layer 18 may be formed using any suitable oxide chemical compositions and procedures.

Figure 1B:
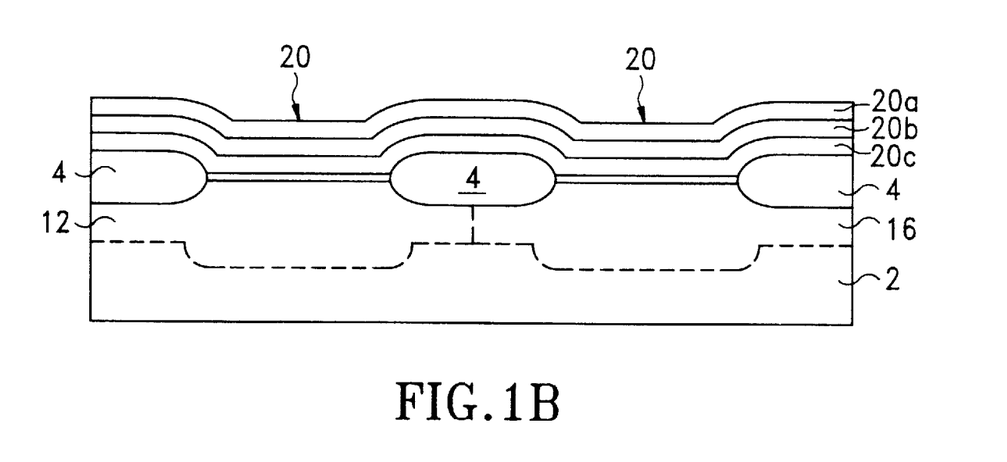
FIG. 1(b) is a cross-sectional view of a semiconductor substrate illustrating the step of forming an undoped thin stacked-amorphous-silicon (SAS) layer according to the present invention.

Referring to FIG. 1(b), after growing the thin gate oxide layer 18, a thin Stacked amorphous-Si (SAS) film 20 is deposited on the FOX regions 4 and the gate oxide layer 18 using a low pressure chemical vapor deposition process. In this preferred embodiment, the stacked an amorphous-Si film 20 is composed of a first amorphous-silicon layer 20a with a thickness of about 200 to 1000 angstroms, a second amorphous-silicon layer 20b with a thickness about 200 to 1000 angstroms, and a third amorphous-silicon layer 20c with a thickness about 200 to 1000 angstroms, the thickness of the stacked-amorphous-silicon film 20 is totally about 600 to 3000 Angstroms and is immediately deposited into the FOX regions 4 and the gate oxide layer 18 at 350 to 600° C. in three steps.

Figure 1C:
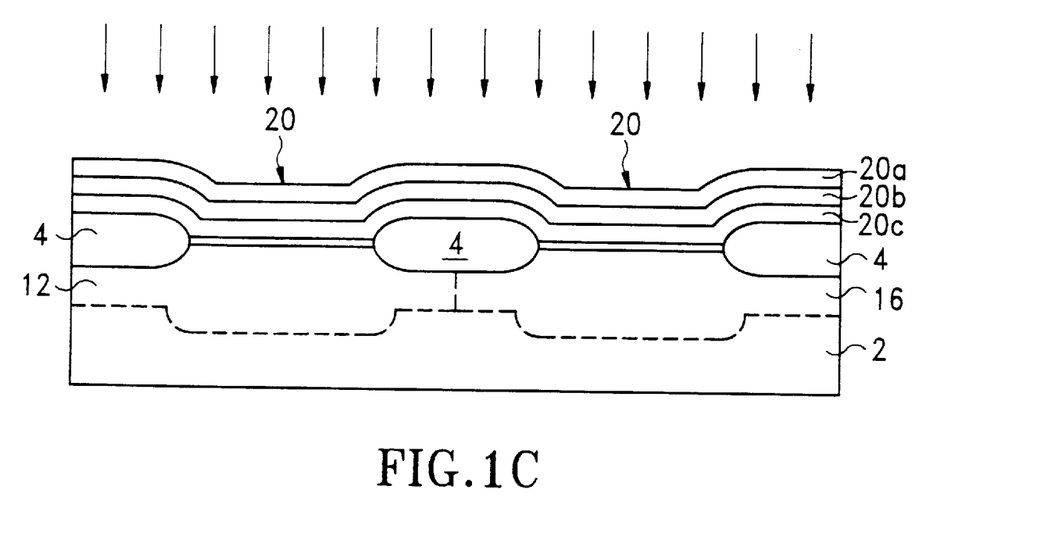
FIG. 1(c) is a cross-sectional view of a semiconductor substrate illustrating the step of performing a lightly nitrogen ion implantation into the thin SAS layer according to the present invention.

Next, referring to FIG. 1(c), a blanket lightly nitrogen ion implantation is performed into the thin Stacked-amorphous-silicon film 20. In this preferred embodiment, the dosage of the nitrogen ion is about $1\times10^{12}$ to $5\times10^{15}$ ions/cm$^2$, and the implant energy is about 5 to 150 KeV.

Figure 1D:
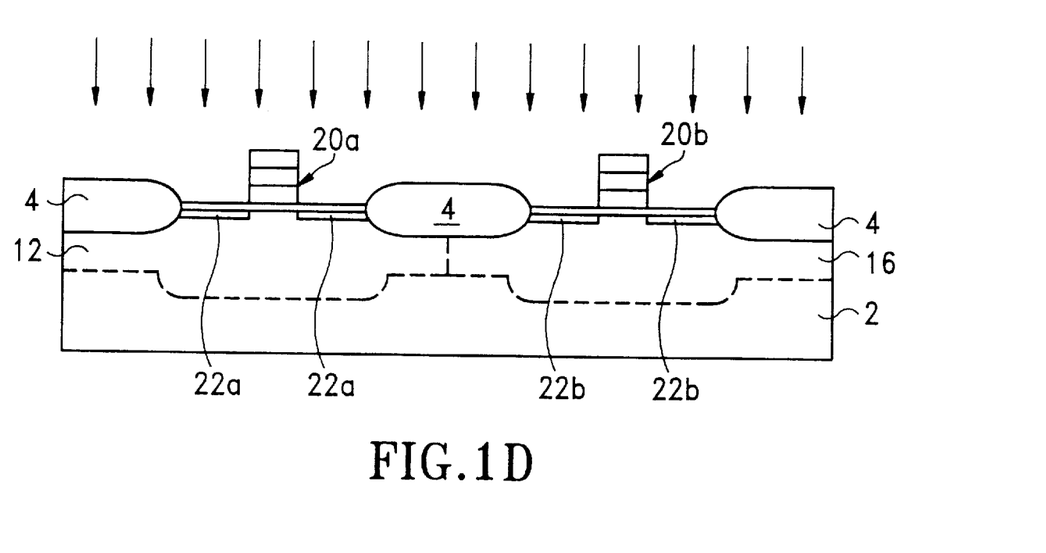
FIG. 1(d) is a cross-sectional view of a semiconductor substrate illustrating the step of defining a gate region and then performing an N-LDD implantation according to the present invention.

Turning to FIG. 1(d), the stacked-amorphous-silicon layer 20 is etched back to form stacked-amorphous-silicon gate 20a, and 20b on the top of P-well 12 and N-well 16, respectively. Then, a first lightly doped drain (LDD) implantation is carried out to form lightly doped source and drain regions 22a in the P-well 12 by using a first photoresist layer covered over the N-well region as a mask. In this preferred embodiment, the dopant is B or BF$_2$, the dosage is about $10^{12}$ to $10^{14}$ ions/cm$^2$, and the implant energy is about 5 to 120 KeV. The first photoresist layer is then removed. A quite similar technique is carried out to form lightly doped source and drain regions 22b in the N-well 16 by using a second photoresist layer covered over the P-well as an implant mask. In this preferred embodiment, the dopant is P, As, or As/P, the dosage is about $10^{12}$ to $10^{14}$ ions/cm$^2$, and the implant energy is about 5 to 120 KeV. After forming the lightly doped source and drain regions 22b in the N-well, the second photoresist layer is removed.

Figure 1E:
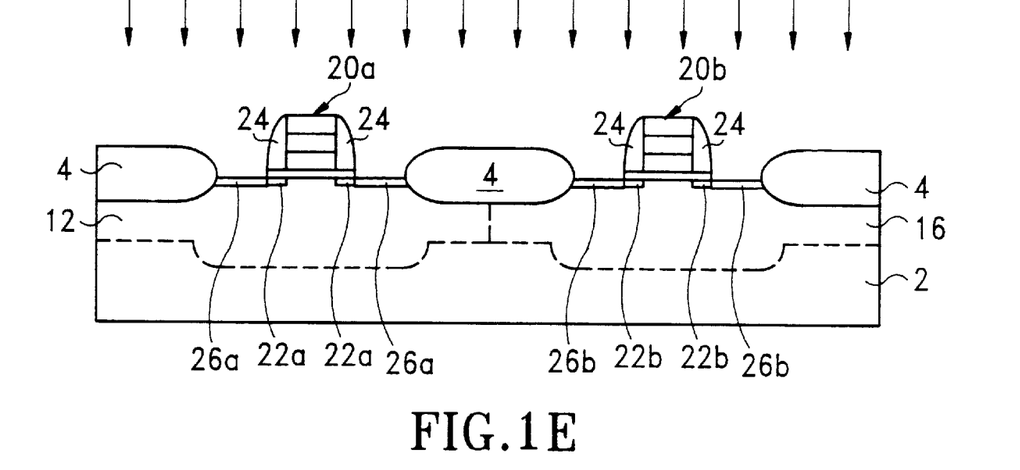
FIG. 1(e) is a cross-sectional view of a semiconductor substrate illustrating the step of forming dielectric spacers and then performing S/D/G implantation according to the present invention.

Referring to FIG. 1(e), a dielectric layer 24 is deposited over the stacked-amorphous-silicon gate 20a, 20b, the FOX regions 4, and the gate oxide layer 18. In a preferred embodiment, the dielectric layer is formed by a chemical vapor deposition process. Next, an anisotropic etching is performed on the dielectric layer to form dielectric side-wall spacers 24 on the side walls of each gate 20a, 20b.

Followed the formation of side wall spacers 24, a first S/D/G implant is performed to implant impurities into the stacked-amorphous-silicon gate 20a atop the P-well 12, and into the P-well 12 to form source and drain region 26a in P-well 12 by using a third photoresist layer covered over the N-well as an implant mask. In this preferred embodiment, the dopant is BF$_2$, the dosage is about $10^{14}$ to $10^{16}$ ions/cm$^2$, and the implant energy is about 0.5 to 80 KeV. The third photoresist layer is then removed. A quite similar technique is carried out to form source and drain regions 26b in the N-well 16 by using a fourth photoresist layer covered over the P-well 12 as an implant mask. In this preferred embodiment, the dopant is As or As/P, the dosage is about $10^{14}$ to $10^{16}$ ions/cm$^2$, and the implant energy is about 0.5 to 80 KeV. After forming the source and drain regions 26b in the N-well 16, the fourth photoresist layer is removed.

Figure 1F:
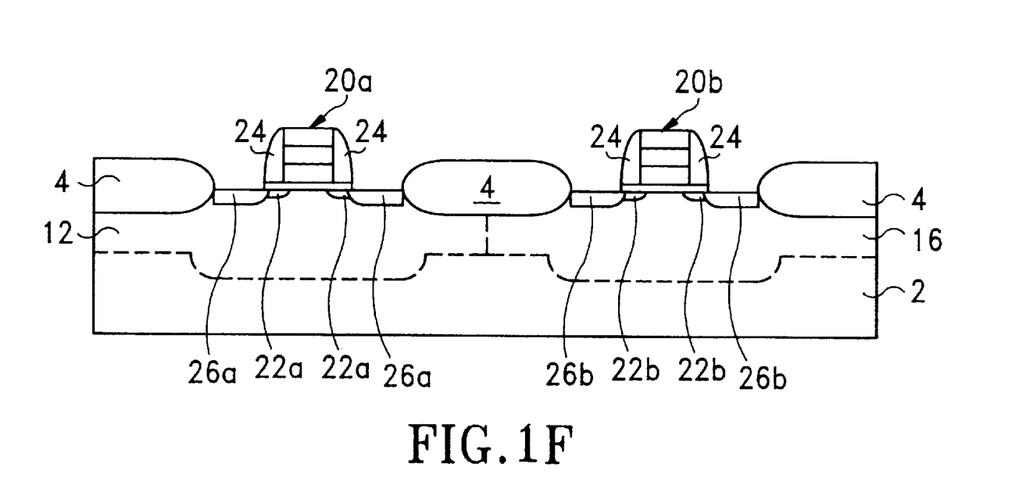

Referring to FIG. 1(f), a high temperature thermal anneal is used to form shallow junctions 26a and 26b in P-well 12 and N-well, respectively. Further, the stacked-amorphous-silicon is transformed to polycrystalline phase and the nitrogen ions in the gate 20a and 20b is found to be segregated into the layer boundary between stacked Si layer and the interface of oxide. This nitrogen segregated into the layer boundary between stacked Si layer and the interface of oxide can act as a diffusion barrier for boron penetration. In this preferred embodiment, the high temperature thermal annealing is performed at a temperature about 700 to 1050 centigrade degrees for 0.1–60 minutes. As shown in the figure, a dual poly gate CMOSFET with a p+ polysilicon gate for PMOSFET and a n+ polysilicon gate for NMOSFET are formed.

The process that illustrated in FIG. 1(a)–FIG. 1(f) are the first embodiment of the present invention.

The followed figures illustrate the second of the present invention.

Figure 2A:
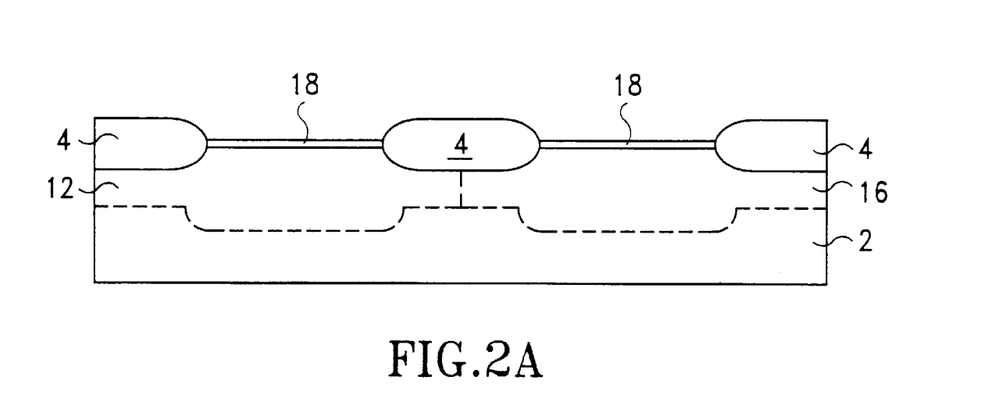
FIG. 2(a) is a cross-sectional view of a semiconductor substrate illustrating the step of growing a ultra-thin gate oxide layer on a semiconductor substrate according to the present invention.
Figure 2B:
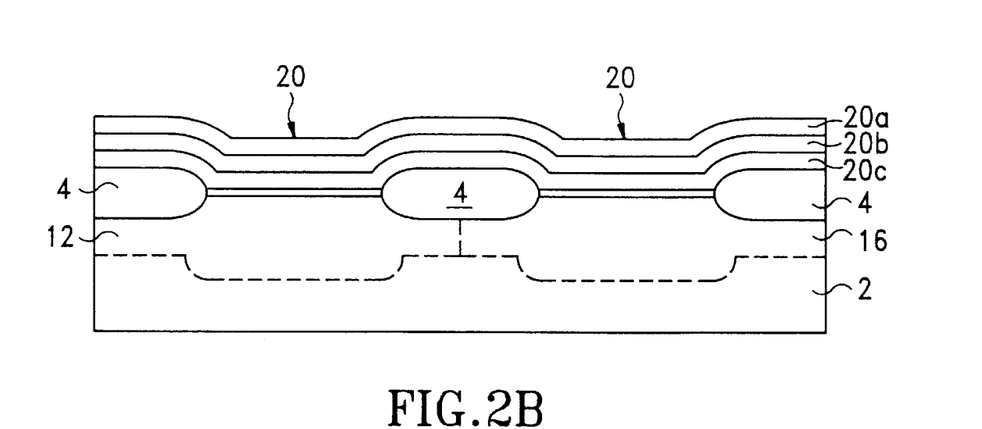
FIG. 2(b) is a cross-sectional view of a semiconductor substrate illustrating the step of forming an undoped thin stacked-amorphous-silicon (SAS) layer on a semiconductor substrate according to the present invention.

Referring to FIG. 2(a) and FIG. 2(b), in this figure, it illustrates the same steps of the invention that we mentioned in FIG. 1(a) and FIG. 1(b).

Figure 2C:
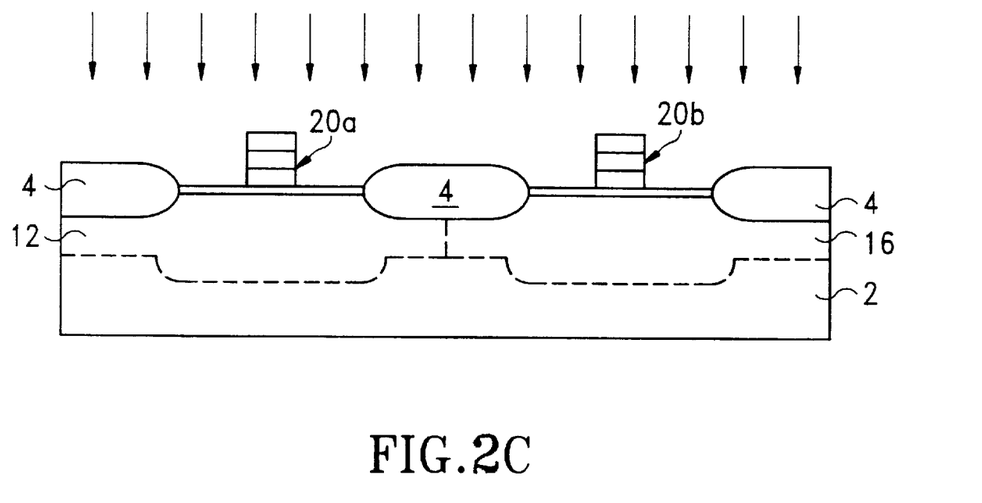
FIG. 2(c) is a cross-sectional view of a semiconductor substrate illustrating the step of defining poly-Si gate and then performing N-LDD implantation according to the present invention.

Turning to FIG. 2(c), the stacked-amorphous-silicon layer 20 is etched back to form stacked-amorphous-silicon gate 20a and 20b on the top of N-well 16 and P-well 12, respectively. Then, a first lightly doped drain (LDD) implantation is carried out to form lightly doped source and drain regions 22a in the P-well 12 by using a first photoresist layer covered over the N-well region as a mask. In this preferred embodiment, the dopant is B or BF$_2$, the dosage is about $10^{12}$ to $10^{14}$ ions/cm$^2$, and the implant energy is about 5 to 120 KeV. The first photoresist layer is then removed. A quite similar technique is carried out to form lightly doped source and drain regions 22b in the N-well 16 by using a second photoresist layer covered over the P-well as a implant mask. In this preferred embodiment, the dopant is P, As, or As/P, the dosage is about $10^{12}$ to $10^{14}$ ions/cm$^2$, and the implant energy is about 5 to 120 KeV. After forming the lightly doped source and drain regions 22b in the N-well, the second photoresist layer is removed.

Figure 2D:
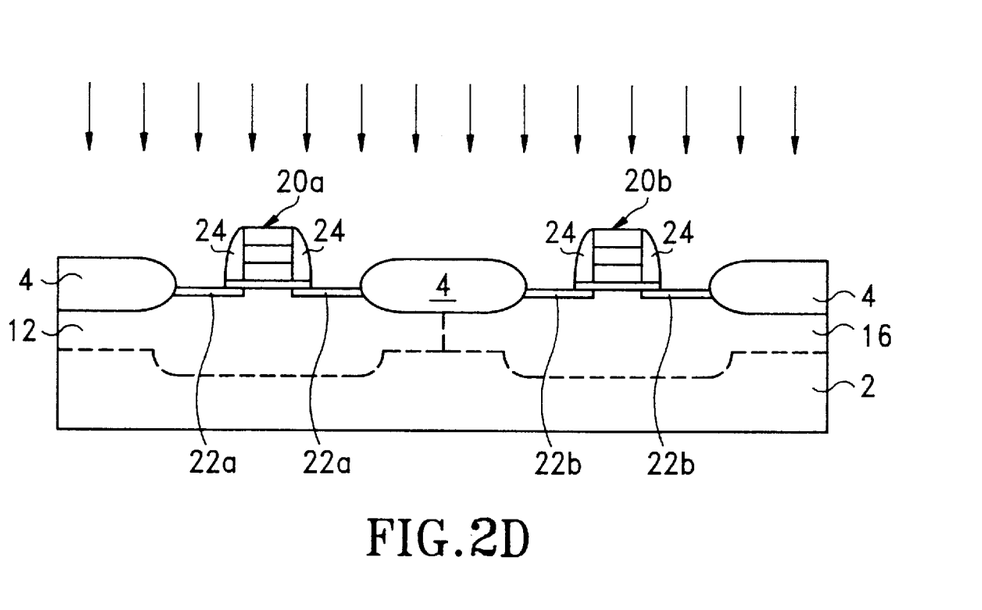
FIG. 2(d) is a cross-sectional view of a semiconductor substrate illustrating the step of forming dielectric spacers and then performing nitrogen implantation according to the present invention.

Turning to FIG. 2(d), a dielectric layer 24 is deposited over the stacked-amorphous-silicon gate 20a, 20b, the FOX regions 4, and the gate oxide layer 18. In a preferred embodiment, the dielectric layer is formed by chemical vapor deposition process. Next, an anisotropic etching is performed on the dielectric layer to form dielectric side-wall spacers 24 on the side walls of each gate 20a, 20b. Subsequently, a blanket lightly nitrogen ion implantation is performed into the thin Stacked-amorphous-silicon film 20. In this preferred embodiment, the dosage of the nitrogen ion is about $10^{12}$ to $5\times10^{15}$ ions/cm$^2$, the implant energy is about 5 to 150 KeV.

Figure 2E:
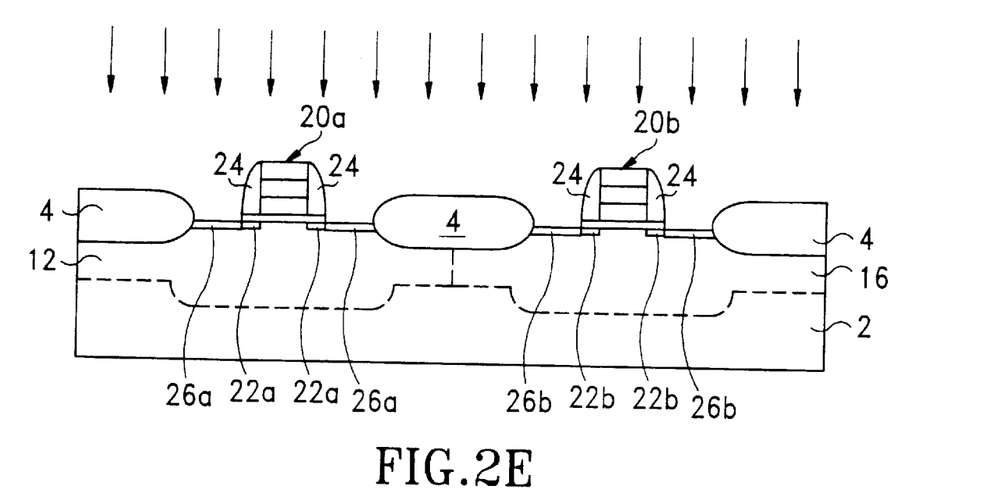
FIG. 2(e) is a cross-sectional view of a semiconductor substrate illustrating the step of performing the S/D/G implantation according to the present invention.

Referring to FIG. 2(e), followed the formation of side wall spacers 24, a first S/D/G implant is performed to implant impurities into the stacked-amorphous-silicon gate 20a atop the P-well 12, and into the P-well 12 to form source and drain region 26a in P-well 12 by using a third photoresist layer covered over the N-well 16 as an implant mask. In this preferred embodiment, the dopant is BF$_2$, the dosage is about $10^{14}$ to $10^{16}$ ions/cm$^2$, and the implant energy is about 0.5 to 50 KeV. The third photoresist layer is then removed. A quite similar technique is carried out to form source and drain regions 26b in the N-well 16 by using a fourth photoresist layer covered over the P-well 12 as a implant mask. In this preferred embodiment, the dopant is As or As/P, the dosage is about $10^{14}$ to $10^{16}$ ions/cm$^2$, and the implant energy is about 0.5 to 80 KeV. After forming the source and drain regions 26b in the N-well 16, the fourth photoresist layer is removed.

Figure 2F:
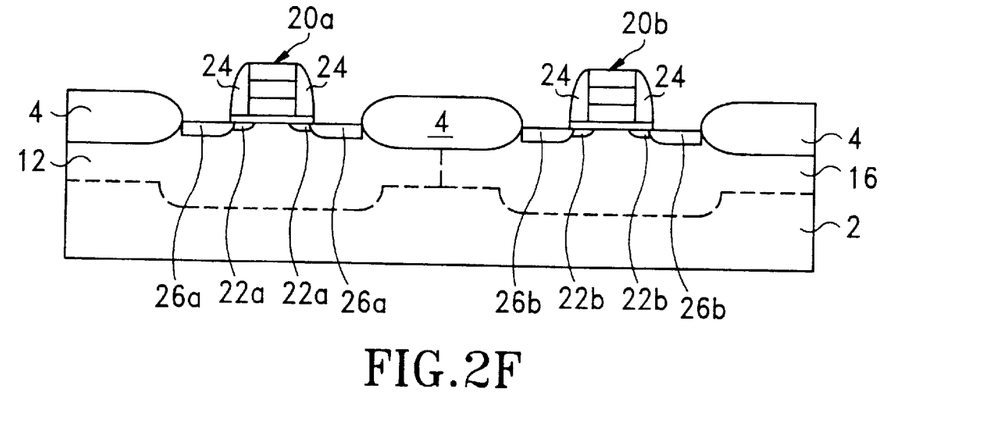
FIG. 2(f) is a cross-sectional view of a semiconductor substrate illustrating the step of performing a high temperature thermal annealing to form shallow junction according to the present invention.

Finally, a high temperature thermal annealing is used to form shallow junctions 26a and 26b in P-well 12 and N-well 16 respectively. Further, the stacked-amorphous-silicon gate 20a, 20b are transformed to polycrystalline phase, and the nitrogen ions in the gate 20a and 20b are found to be segregated into the layer boundary between stacked-Si layer and the interface of oxide and poly-Si. This nitrogen segregated into the layer boundary between stacked-Si layer and the interface of oxide and poly-Si can act as a diffusion barrier for boron penetration. In this preferred embodiment, the high temperature thermal annealing is performed at a temperature about 700 to 1050 centigrade degrees for 0.1–60 minutes. As shown in FIG. 2(f), a dual poly gate CMOS is formed.

The benefits of this invention are: (1) the device reliability could be improved by using the dual poly gate CMOS technology; (2) the boron penetration effects in p+ poly gate pMOSFETs could be fully suppressed by combining the nitrogen doping technology and the stacked-Si layer as gate material; and (3) the side effects of the heavy nitrogen ion implantation could be avoided.

As is understood by a person skilled in the art, the foregoing preferred embodiment of the present invention is illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention. For example, this method that we proposed for fabricating ultra-short channel nMOSFETs devices with self-aligned silicided contact also can use in fabricating pMOFETS or CMOSFETs.

The embodiments of the invention in which an exclusive property or privilege is claimed are defined as follows:

1. A method for fabricating a metal oxide semiconductor field effect transistor in a semiconductor substrate, said method comprising the steps of:

forming a gate oxide layer on said substrate;

forming a first amorphous silicon layer over said gate oxide layer;

forming a second amorphous silicon layer over said first silicon layer;

forming a third amorphous silicon layer over said second silicon layer, wherein said first amorphous silicon layer, said second amorphous silicon layer, and said third amorphous silicon layer together act as a stacked-amorphous silicon layer;

performing diffusion barrier nitrogen ion implantation in a dosage between $1\times10^{12}$ and $4\times10^{15}$ cm$^{-2}$ into said stacked-amorphous gate and said substrate;

patterning said stacked-amorphous silicon layer to define a gate structure;

performing a first ion implantation to dope ions through said gate oxide layer into said substrate, thereby forming first doped ion regions to serve as lightly doped source and drain of said transistor;

forming a dielectric layer over said gate structure and said gate oxide layer;

etching said dielectric layer to form side-wall spacers;

performing a second ion implantation to dope ions into said substrate, thereby forming second doped ion regions next to said first doped ion regions to serve as source and drain of said transistor; and performing a thermal annealing on said stacked-amorphous silicon gate and said substrate, wherein said diffusion barrier ion in said stacked-amorphous silicon gate being segregated between said stacked-amorphous silicon layer and said oxide layer to act as a diffusion barrier, said stacked-amorphous silicon gate being convert into poly silicon gate and thereby forming shallow source and drain junction in said substrate.

2. The method of claim 1, wherein said first amorphous silicon layer have a thickness about 200 to 1000 Angstroms.

3. The method of claim 1, wherein said second amorphous silicon layer have a thickness about 200 to 1000 Angstroms.

4. The method of claim 1, wherein said third amorphous silicon layer have a thickness about 200 to 1000 Angstroms.

5. The method of claim 1, wherein said thermal annealing is performed at temperature about 700 to 1050 Centigrade for 0.1–60 minutes.

6. A method for fabricating a metal oxide semiconductor field effect transistor in a semiconductor substrate, said method comprising the steps of:

forming a gate oxide layer on said substrate;

forming a first amorphous silicon layer over said gate oxide layer;

forming a second amorphous silicon layer over said first silicon layer;

forming a third amorphous silicon layer over said second silicon layer, wherein said first amorphous silicon layer, said second amorphous silicon layer, and said third amorphous silicon layer together act as a stacked-amorphous silicon layer;

pattering said stacked-amorphous silicon layer to define a stacked-amorphous gate structure;

performing a first ion implantation to dope ions through said gate oxide layer into said substrate, thereby forming first doped ion regions to serve as lightly doped source and drain of said transistor;

forming a dielectric layer over said gate structure and said gate oxide layer;

etching said dielectric layer to form side-wall spacers;

performing diffusion barrier nitrogen ion implantation in a dosage between $1\times10^{12}$ and $4\times10^{15}$ cm$^{-2}$ into said stacked-amorphous gate and said substrate;

performing a second ion implantation to dope ions into said substrate, thereby forming second doped ion regions next to said first doped ion regions to serve as source and drain of said transistor; and performing a thermal annealing on said stacked-amorphous silicon gate and said substrate, wherein said diffusion barrier ion in said stacked-amorphous silicon gate being segregated between said stacked-amorphous silicon layer and said oxide layer to act as a diffusion barrier, said stacked-amorphous silicon gate being convert into poly silicon gate and thereby forming shallow source and drain junction in said substrate.

7. The method of claim 6, wherein said first amorphous silicon layer have a thickness about 200 to 1000 Angstroms.

8. The method of claim 6, wherein said second amorphous silicon layer have a thickness about 200 to 1000 Angstroms.

9. The method of claim 6, wherein said third amorphous silicon layer have a thickness about 200 to 1000 Angstroms.

10. The method of claim 6, wherein said thermal annealing is performed at temperature about 700 to 1050 Centigrade for 0.1–60 minutes.

* * * * *